(12) United States Patent
Maekawa (10) Patent No.: US 11,091,107 B2
(45) Date of Patent: Aug. 17, 2021

(54) CONNECTION UNIT AND POWER SUPPLY SYSTEM

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Kosei Maekawa, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/630,636

(22) PCT Filed: Aug. 21, 2018

(86) PCT No.: PCT/JP2018/030729
§ 371 (c)(1),
(2) Date: Jan. 13, 2020

(87) PCT Pub. No.: WO2019/044573
PCT Pub. Date: Mar. 7, 2019

(65) Prior Publication Data
US 2020/0207296 A1     Jul. 2, 2020

(30) Foreign Application Priority Data

Aug. 31, 2017 (JP) .............................. JP2017-166863

(51) Int. Cl.
*H02J 7/34* (2006.01)
*H03K 17/567* (2006.01)
(Continued)

(52) U.S. Cl.
CPC .......... *B60R 16/033* (2013.01); *B62D 5/0457* (2013.01); *H02J 7/34* (2013.01); *H03K 17/567* (2013.01); *H03K 17/693* (2013.01)

(58) Field of Classification Search
CPC ........ B60R 16/033; B62D 5/0457; H02J 7/34; H03K 17/567; H03K 17/693
(Continued)

(56) References Cited

U.S. PATENT DOCUMENTS

2011/0128714 A1  6/2011  Terao et al.
2016/0152147 A1* 6/2016  Sasaki ....................... B60L 1/00
                                                            307/10.1
2017/0047841 A1* 2/2017  Zojer .................. H02M 1/4233

FOREIGN PATENT DOCUMENTS

JP    2011-178384 A    9/2011
JP    2011-229353 A   11/2011
(Continued)

OTHER PUBLICATIONS

International Search Report, Application No. PCT/JP2018/030729, dated Oct. 2, 2018. ISA/Japan Patent Office.

*Primary Examiner* — John W Poos
(74) *Attorney, Agent, or Firm* — Honigman LLP (57) ABSTRACT

A connection unit includes: a first terminal; a second terminal; a third terminal; a first switch part and a second switch part connected in series between the first terminal and the second terminal; a first diode; and a second diode, wherein the third terminal is connected between the first switch part and the second switch part that are connected in series, the flow of electricity in one direction between the third terminal and at least one of the first terminal and the second terminal is enabled and the flow of electricity in the direction opposite to the one direction is interrupted, by at least one of the first switch part and the second switch part is turned off, and flow of electricity between the first terminal and the second (Continued)

terminal is interrupted in both directions by the first switch part and the second switch part being turned off.

14 Claims, 4 Drawing Sheets

(51) Int. Cl.
    *H03K 17/693*     (2006.01)
    *B60R 16/033*     (2006.01)
    *B62D 5/04*     (2006.01)

(58) Field of Classification Search
    USPC .......................................... 307/10.1
    See application file for complete search history.

(56) References Cited

FOREIGN PATENT DOCUMENTS

| JP | 2014-027345 A | 2/2014 |
| JP | 2016-140135 A | 8/2016 |
| JP | 2017-084623 A | 5/2017 |

\* cited by examiner

CONNECTION UNIT AND POWER SUPPLY SYSTEM

CROSS-REFERENCE TO RELATED APPLICATIONS

This application is the U.S. national stage of PCT/JP2018/030729 filed on Aug. 21, 2018, which claims priority of Japanese Patent Application No. JP 2017-166863 filed on Aug. 31, 2017, the contents of which are incorporated herein.

TECHNICAL FIELD

In this specification, a technique that can interrupt the flow of electricity between several power supplies is disclosed.

BACKGROUND

Conventionally, a power supply system has been known, which includes a plurality of power supplies that can supply power to a load, and that can interrupt the flow of electricity between the plurality of power supplies with a switch. In the power supply system of JP 5471767B (FIG. 1), a configuration is disclosed in which a generator, a starter, and a battery are connected in parallel, a DC/DC converter and a power storage part that are connected in series are connected in parallel to a load, and a FET is provided in a conduction path connecting the battery side and the power storage part side. When the FET of the power supply system is on, flow of electricity between the battery side and the power storage part side is enabled in both directions, and when the FET is off, flow of electricity from the battery side to the power storage part side is enabled, and flow of electricity from the power storage part side to the battery side is interrupted, due to the parasitic diode of the FET. For this reason, an instantaneous voltage drop caused when the engine is started does not affect the load.

In the power supply system of JP 5494498B (FIG. 9), a configuration is disclosed in which an alternator, a starter, an electrical load, and a lead storage battery are connected in parallel, a lithium storage battery and an electrical load requiring constant voltage are connected in parallel, and a pair of MOS-FETs are connected in series to a conduction path connecting the lead storage battery side and the lithium storage battery side. The pair of MOS-FETs of this power supply system are connected so that their parasitic diodes are opposite to each other. With this configuration, flow of electricity is enabled in both directions when the pair of MOS-FETs are both on, and flow of electricity is interrupted both directions when the pair of MOS-FETs are both off. For this reason, when the MOS-FETs are off, a voltage drop on one storage battery side does not affect the other storage battery side.

In JP 5471767B (FIG. 1), it is possible to let electricity flow only in one direction between the plurality of storage batteries when the FET is off. On the other hand, in JP 5494498B (FIG. 9), flow of electricity between the plurality of storage batteries is interrupted in both directions when the pair of MOS-FETs are off. Depending on the application of the power supply system, it is conceivable to allow the flow of electricity in only one direction between the plurality of storage batteries, or to interrupt flow of electricity in both directions between the plurality of storage batteries. However, in such a case, it is necessary to form a new power supply system in which the circuit configuration is changed. For this reason, there is a problem that the circuit configuration becomes complicated and the manufacturing cost of the power supply system becomes high.

The technique disclosed in the present specification has been completed based on the above-mentioned circumstances, and an object thereof is to provide a connection unit and a power supply system that can cope with a change in flow of electricity direction between a first power supply and a second power supply while reducing the manufacturing cost.

SUMMARY

The connection unit described in the present specification is a connection unit that is disposed between a first conduction path that is connected to a first power supply and a second conduction path that is connected to a second power supply, and that can electrically connect the first conduction path to the second conduction path, the connection unit including: a first terminal that is connectable to the first conduction path or the second conduction path; a second terminal that is connectable to the second conduction path in a state where the first terminal is connected to the first conduction path, and that is connectable to the second conduction path in a state where the first terminal is connected to the second conduction path; a third terminal that is connectable to the first conduction path in a state where at least one of the first terminal and the second terminal is connected to the second conduction path; a first switch part and a second switch part that are connected in series to each other between the first terminal and the second terminal; a first diode that is connected in parallel to the first switch part; and a second diode that is connected in parallel to the second switch part, and that is connected in the opposite direction to the first diode, wherein the third terminal is electrically connected between the first switch part and the second switch part that are connected in series, the flow of electricity in one direction between the third terminal and at least one of the first terminal and the second terminal is enabled and the flow of electricity in the direction opposite to the one direction is interrupted by the first diode and the second diode, by at least one of the first switch part and the second switch part being turned off, and flow of electricity in both directions between the first terminal and the second terminal is interrupted by the first diode and the second diode, in a state where the first switch part and the second switch part are turned off.

With this configuration, by changing the combination of the first conduction path or the second conduction path connected to the first terminal, the second terminal, and the third terminal, a mode in which the flow of electricity in one direction between the third terminal and at least one of the first terminal and the second terminal is enabled by the first diode and the second diode by at least one of the first switch part and the second switch part being turned off, and a mode in which flow of electricity between the first terminal and the second terminal is interrupted in both directions by the first diode and the second diode in a state where the first switch part and the second switch part are turned off can be realized using a shared connection unit. As a result, the connection unit can be shared when a power supply system is configured in which the direction of the flow of electricity between the first conduction path and the second conduction path is changed. Therefore, it is possible to cope with changes in the direction of the flow of electricity between the first power supply and the second power supply while reducing the manufacturing cost.

The following aspects are preferable as the aspects of the technique described in the present specification.

The first switch part and the first diode may be configured by a first FET, and the second switch part and the second diode may be configured by a second FET, and the first diode and the second diode may be arranged such that their anodes are electrically connected to the third terminal.

With this configuration, compared with a configuration in which the cathodes of the diodes are electrically connected to the third terminal, a failure of the FET due to a large current flowing through the diode can be suppressed, for example, when a ground fault on the generator side occurs in a situation in which the third terminal is connected to the first conduction path to which the generator is connected.

The connection unit may include: a plurality of the first switch parts; a plurality of the second switch parts; a plurality of the first diodes; and a plurality of the second diodes, wherein the plurality of first diodes are connected in parallel to each other, and the plurality of second diodes are connected in parallel to each other.

In this manner, a current is divided into a plurality of paths, so that the current that can flow can be increased.

The power supply system may be a power supply system including: the connection unit; the first power supply; the second power supply; the first conduction path; the second conduction path; and a load that can receive power from at least one of the first power supply and the second power supply.

With this configuration, a power supply system can be configured in which the direction of the flow of electricity between the first power supply and the second power supply can be changed using a shared connection unit.

The first terminal and the second terminal may be both connected to the second conduction path.

With this configuration, the current capacity between the first conduction path and the second conduction path can be increased.

The first terminal may be connected to the first conduction path, the second terminal may be connected to the second conduction path, and the third terminal may be open.

The load may be an electric power steering apparatus.

Advantageous Effects of Invention

According to the technique disclosed in the present specification, it is possible to cope with the change in the direction of the flow of electricity between the first power supply and the second power supply while reducing the manufacturing cost.

DETAILED DESCRIPTION OF PREFERRED EMBODIMENTS

A power supply system 10 of the embodiment can be mounted, for example, in a vehicle such as an electric vehicle.

Power Supply System 10

Figure 1:
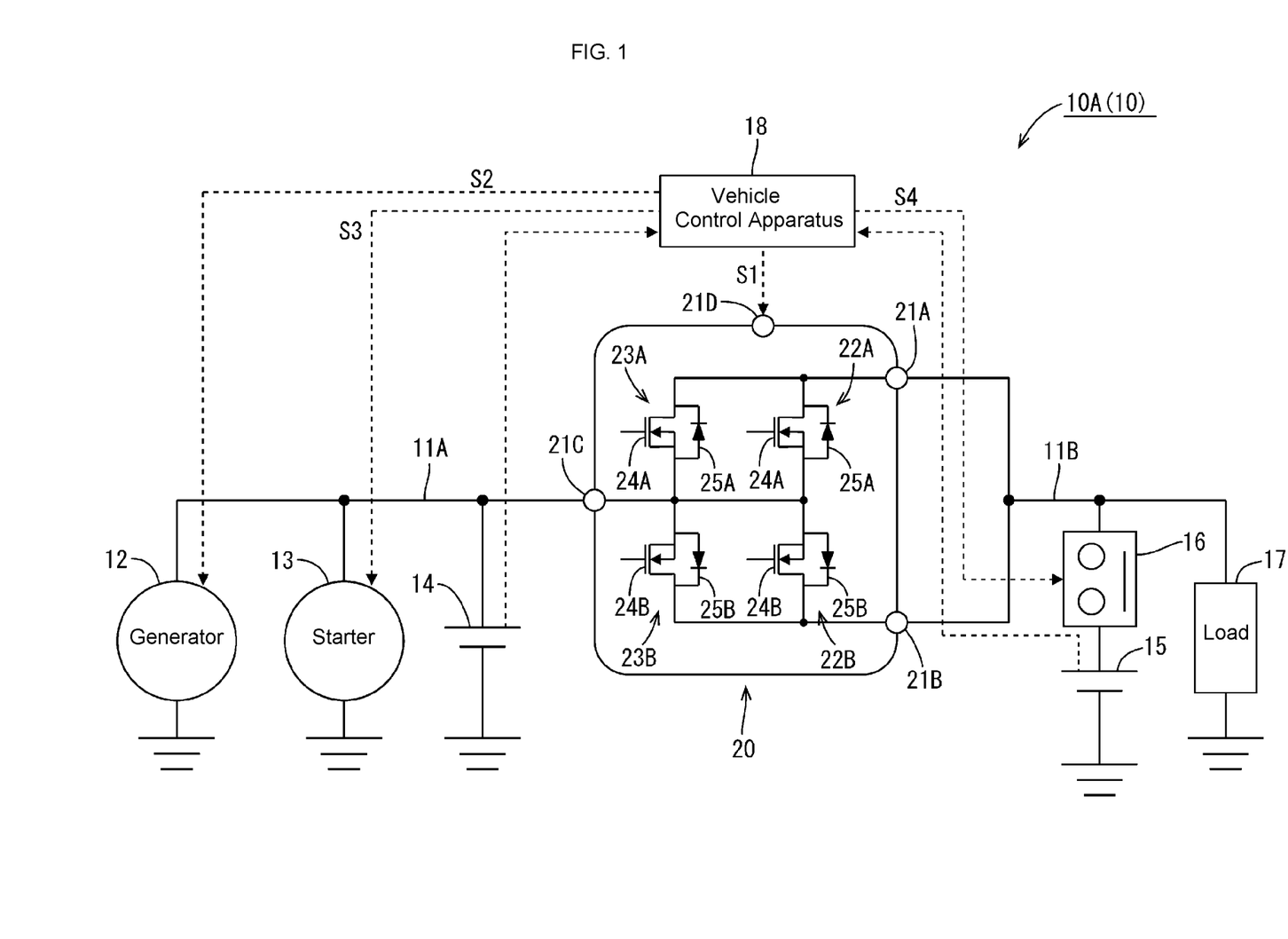
FIG. 1 is a diagram illustrating a first mode of a power supply system according to an embodiment.

As shown in FIG. 1, the power supply system 10 includes a generator 12 (an example of a "first power supply"), a starter 13, a first power storage part 14 (an example of the "first power supply"), a second power storage part 15 (an example of a "second power supply"), a load 17, a vehicle control apparatus 18, and a connection unit 20 (in FIG. 1, a part of the inside of the connection unit 20 is omitted) that is connected between the generator 12 and the first power storage part 14 and the second power storage part 15.

The generator 12 includes, for example, an alternator and a rectifier. An alternating current generated by the alternator is converted to a direct current, and is output. The starter 13 receives power from the first power storage part 14, and starts an engine.

The first power storage part 14 can be a lead battery, for example. The second power storage part 15 can be a lithium ion storage battery or an electric double layer capacitor, for example. The second power storage part 15 is connected with a protection switch 16 for protecting the second power storage part 15 by blocking the connection in the event of an abnormality. As the protection switch 16, an electromagnetic switch that includes a coil and a contact portion is used.

The load 17 can be any of various electrical components of the vehicle. In the present embodiment, the load 17 is an electric power steering apparatus, for example. An electronic component such as a motor of the load 17 operates, by the load 17 receiving power from at least one of the generator 12, the first power storage part 14, and the second power storage part 15. The generator 12, the starter 13, and the first power storage part 14 are connected in parallel between the first conduction path 11A and the ground, and the second power storage part 15 and the load 17 are connected in parallel between the second conduction path 11B and the ground. The first conduction path 11A and the second conduction path 11B are made of electric wires or the like, and are connected to the connection unit 20.

The vehicle control apparatus 18 is provided, for example, in an ECU (Electronic Control Unit) of the vehicle. The ECU includes a circuit part that includes a circuit board on which electronic components are mounted, and a connector portion for connecting to the outside. The ECU can detect the voltage of the first power storage part 14 and the second power storage part 15, perform charge/discharge control, control the supply of power to the load 17, and the like. The vehicle control apparatus 18 of the present embodiment is connected to an external signal terminal 21D of the connection unit 20. The vehicle control apparatus 18 outputs a control signal S1 to turn FETs 22A, 22B, 23A, and 23B on/off, and controls the flow of electricity between the first conduction path 11A and the second conduction path 11B. The connection unit 20 described later may be provided in the ECU, but it may also be provided outside the ECU.

The vehicle control apparatus 18 outputs control signals S1 to S4 for respectively controlling the connection unit 20, the generator 12, the switch of the starter 13, and the protection switch 16. The vehicle control apparatus 18 outputs the control signals S1 to S4 to the connection unit 20, the generator 12, the switch of the starter 13, the protection switch 16, and the like, for example, in response to the operation of the ignition key (operation part) of the vehicle. Also, the vehicle control apparatus 18 receives a signal such as a voltage that indicates the state of charge, which is transmitted from the first power storage part 14 and the second power storage part 15.

Connection Unit 20

Figure 2:
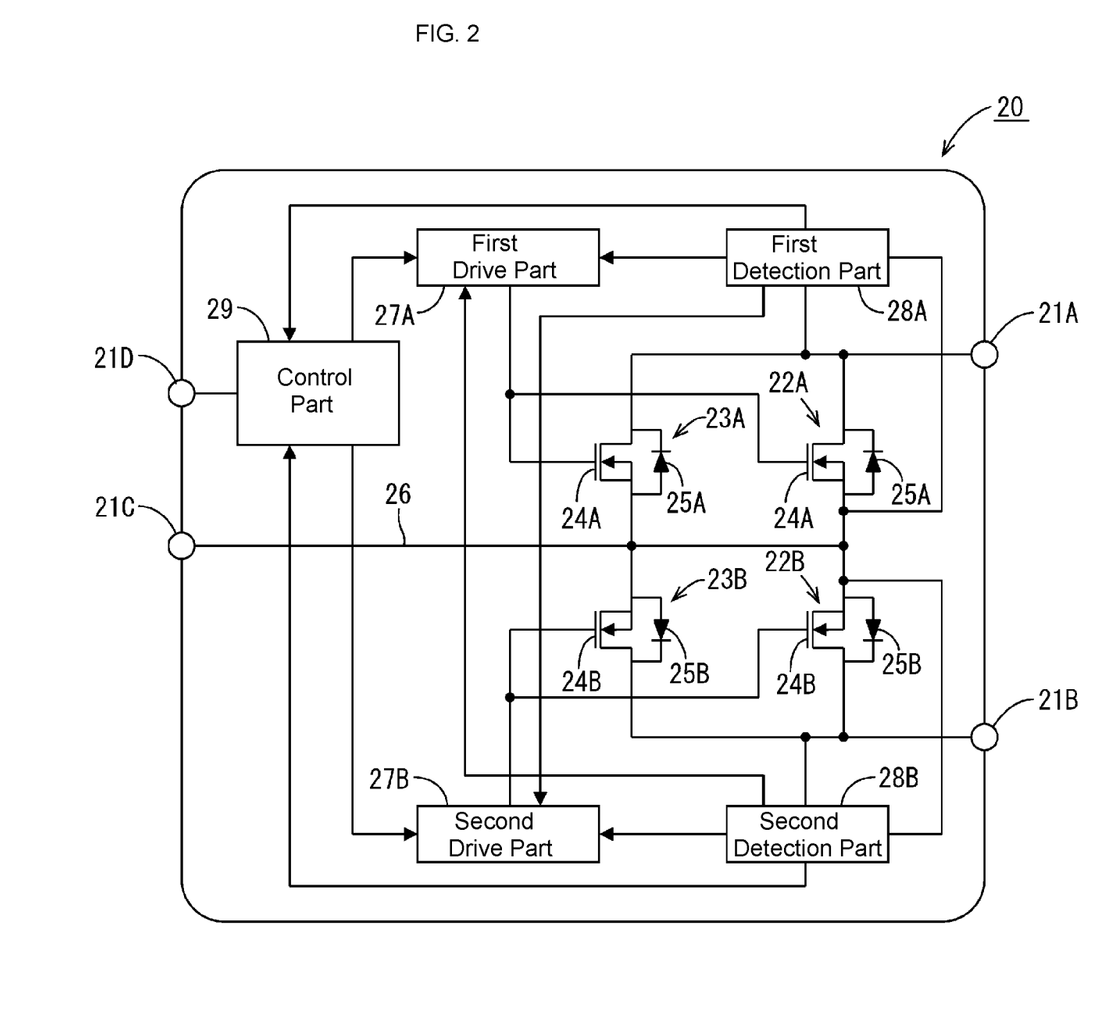
FIG. 2 is a diagram illustrating an electrical configuration of a connection unit.

The connection unit 20 is configured, for example, by mounting a plurality of electronic components and a plurality of connector portions on a circuit board (not shown). As shown in FIG. 2, the connection unit 20 includes four terminals 21A to 21D that are disposed in the plurality of connector portions, four FETs (Field effect transistors) 22A, 22B, 23A, and 23B, a plurality of drive parts 27A and 27B, a plurality of detection parts 28A and 28B, and a control part 29. The four terminals 21A to 21D include first to third terminals 21A to 21C that are connectable to the terminals of the terminal portions of the first conduction path 11A and the second conduction path 11B, and the external signal terminal 21D to be connected to the terminal of the terminal portion of the signal line that is connected to the vehicle control apparatus 18. The external signal terminal 21D inputs and outputs signals into and out of the control part 29.

The first to third terminals 21A to 21C are connectable to the terminal of the terminal portions of either the first conduction path 11A or the second conduction path 11B, according to the mode of the power supply system 10 described later. The four FETs 22A, 22B, 23A, and 23B that are connected in series-parallel are connected between the first terminal 21A and the second terminal 21B.

The four (the plurality of) FETs 22A, 22B, 23A, and 23B are, for example, N-type MOSFETs, and include first FETs 22A and 23A connected in parallel and second FETs 22B and 23B connected in parallel. The first FETs 22A and 23A and the second FETs 22B and 23B are connected in series. The third terminal 21C is electrically connected to the conduction path 26 between the first FET 22A and the second FET 22B that are connected in series, and between the first FET 23A and the second FET 23B.

The first FETs 22A and 23A both include a first switch part 24A and a first diode 25A, and the second FETs 22B and 23B both include a second switch part 24B and a second diode 25B. The first diodes 25A and the second diodes 25B are parasitic diodes of the FETs 22A, 22B, 23A, and 23B, and are connected such that the directions of the flow of electricity in the diodes 25A and 25B that are connected in series are opposite to each other. The anodes of the diodes 25A and 25B are connected to the conduction path 26 and are connected to the third terminal 21C. On the other hand, the cathodes of the pair of first diodes 25 connected in parallel are both electrically connected to the first terminal 21A, and the cathodes of the pair of second diodes 25B connected in parallel are both electrically connected to the second terminal 21B. The gates of the FETs 22A, 22B, 23A, and 23B are connected to the plurality of drive parts 27A and 27B.

The plurality of drive parts 27A and 27B include a first drive part 27A and a second drive part 27B. The first drive part 27A receives signals from the control part 29 and the first detection part 28A, outputs a drive signal to the gates of the first FETs 22A and 23A, and turns the first FETs 22A and 23A on and off. The second drive part 27B receives signals from the control part 29 and the second detection part 28B, outputs a signal to the gates of the second FETs 22B and 23B, and turns the second switches on and off.

The plurality of detection parts 28A and 28B include a first detection part 28A and a second detection part 28B. The first detection part 28A detects at least one of the current and voltage on the drain sides of the first FETs 22A and 23A, and determines whether there is an abnormality such as low voltage or overcurrent. The second detection part 28B detects the current and voltage on the drain sides of the second FETs 22B and 23B, and determines whether there is an abnormality such as low voltage or overcurrent.

The detection result and abnormality determination result of the first detection part 28A are transmitted to the first drive part 27A and the control part 29. The detection result and abnormality determination result of the second detection part 28B are transmitted to the second drive part 27B and the control part 29. If there is an abnormality determination in the first detection part 28A or the second detection part 28B, the drive parts 27A and 27B turn off the FET 22A or 23A (22B or 23B) for which the abnormality determination has been made. The control part 29 receives detection signals from the detection parts 28A and 28B, and the control signal S1 from the vehicle control apparatus 18, and controls the driving of the drive parts 27A and 27B based on the detection signals and the control signal S1.

Modes of Power Supply System 10

The power supply system 10 can be changed to the first to third modes 10A to 10C depending on the connection form of the first conduction path 11A, the second conduction path 11B, and the like to the first to third terminals 21A to 21C of the connection unit 20.

First Mode 10A

As shown in FIG. 1, in the first mode 10A, the first conduction path 11A is connected to the third terminal 21C of the connection unit 20, and the second conduction path 11B is connected to the first terminal 21A and the second terminal 21B. The first conduction path 11A is connected to the ground via the generator 12, the starter 13, and the first power storage part 14 that are connected in parallel. The second conduction path 11B is connected to the ground via the second power storage part 15 and the load 17 that are connected in parallel.

According to the first mode 10A, flow of electricity between the first conduction path 11A and the second conduction path 11B is enabled in both directions in a state where FETs 22A, 22B, 23A, and 23B are turned on by signals from the drive parts 27A and 27B. On the other hand, in a state where all of the FETs 22A, 22B, 23A, and 23B are turned off, the flow of electricity from the first conduction path 11A side to the second conduction path 11B side is enabled, and the flow of electricity from the second conduction path 11B side to the first conduction path 11A side is interrupted, by the diodes 25A and 25B. When the engine is started, the FETs 22A, 22B, 23A, and 23B of the connection unit 20 are turned off, and the flow of electricity from the second power storage part 15 side to the first power storage part 14 side is interrupted. Therefore, an instantaneous voltage drop caused when the engine is started does not affect the second power storage part 15 and the load 17. Also, because current flows through the FETs 22A, 22B, 23A, and 23B through a plurality of paths, the current capacity can be increased.

Second Mode 10B

Figure 3:
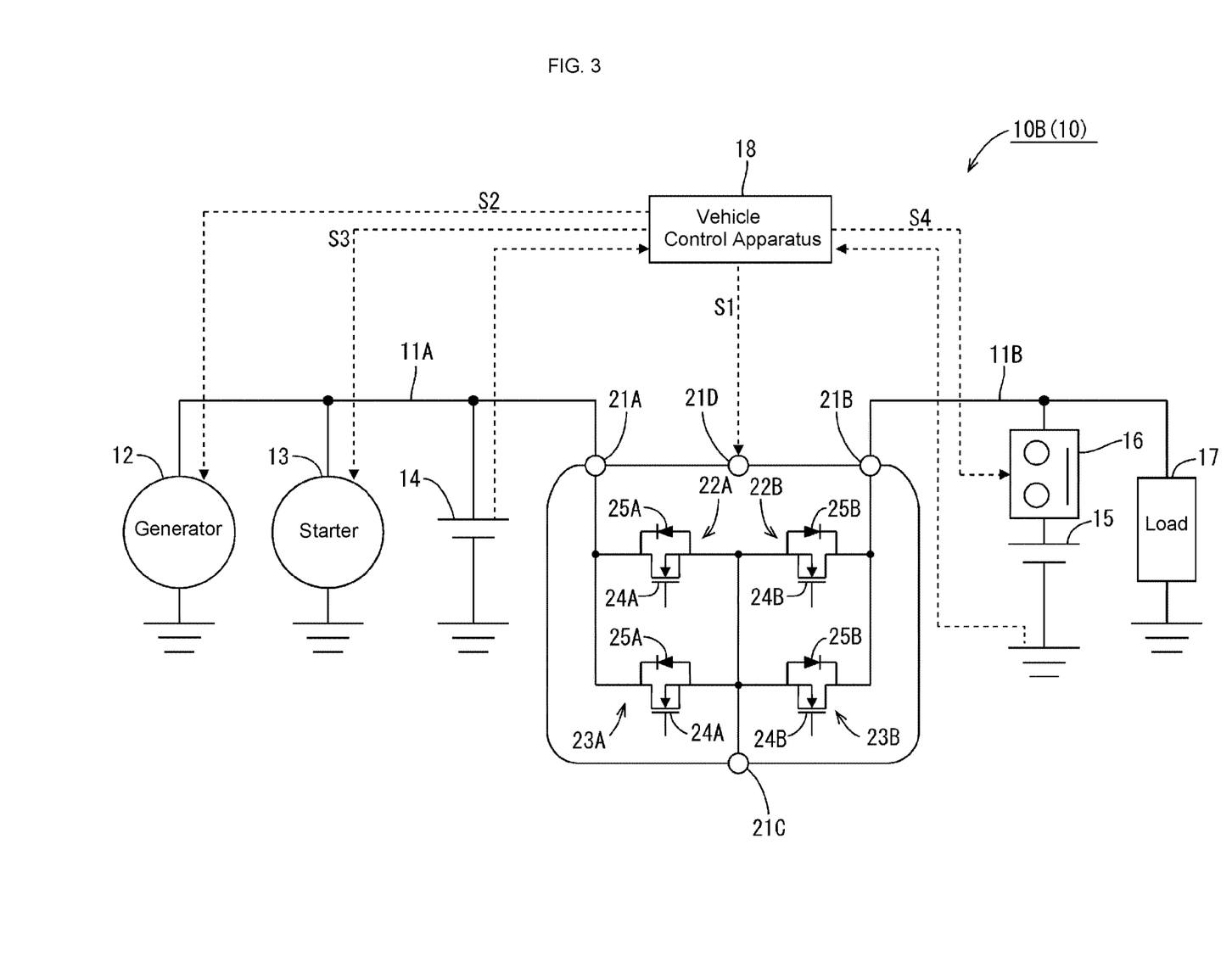
FIG. 3 is a diagram illustrating a second mode of the power supply system.

As shown in FIG. 3, in the second mode 10B, the first conduction path 11A is connected to the first terminal 21A, the second conduction path 11B is connected to the second terminal 21B, and the third terminal 21C is not connected to the external conduction path and is open. The first conduction path 11A is connected to the ground via the generator 12, the starter 13, and the first power storage part 14 that are connected in parallel. The second conduction path 11B is connected to the ground via the second power storage part 15 and the load 17 that are connected in parallel.

According to the second mode 10B, flow of electricity in both directions between the first conduction path 11A and the second conduction path 11B is enabled in a state where FETs 22A, 22B, 23A, and 23B are turned on by signals from the drive parts 27A and 27B. On the other hand, in a state where all of the FETs 22A, 22B, 23A, and 23B are turned off, flow of electricity in both directions between the first conduction path 11A and the second conduction path 11B is interrupted, because the directions of the diodes 25A and 25B connected in series are opposite to each other. For this reason, in the state where all of the FETs 22A, 22B, 23A, and 23B are turned off, the power sources between the first power storage part 14 and the generator 12, and the second power storage part 15 and the load 17 are separated. Accordingly, the influence (voltage drop or the like) on one side between the first conduction path 11A and the second conduction path 11B does not reach the other side. Note, that the flow of electricity in one direction between the first conduction path 11A and the second conduction path 11B may be enabled, but the flow of electricity in the opposite direction may also be interrupted, by a configuration in which a drive signal is output from one of the drive parts 27A and 27B in response to a signal from the control part 29, and either of the first FETs 22A and 23A or the second FETs 22B and 23B are turned on, and the others are turned off.

Third Mode 10C

Figure 4:
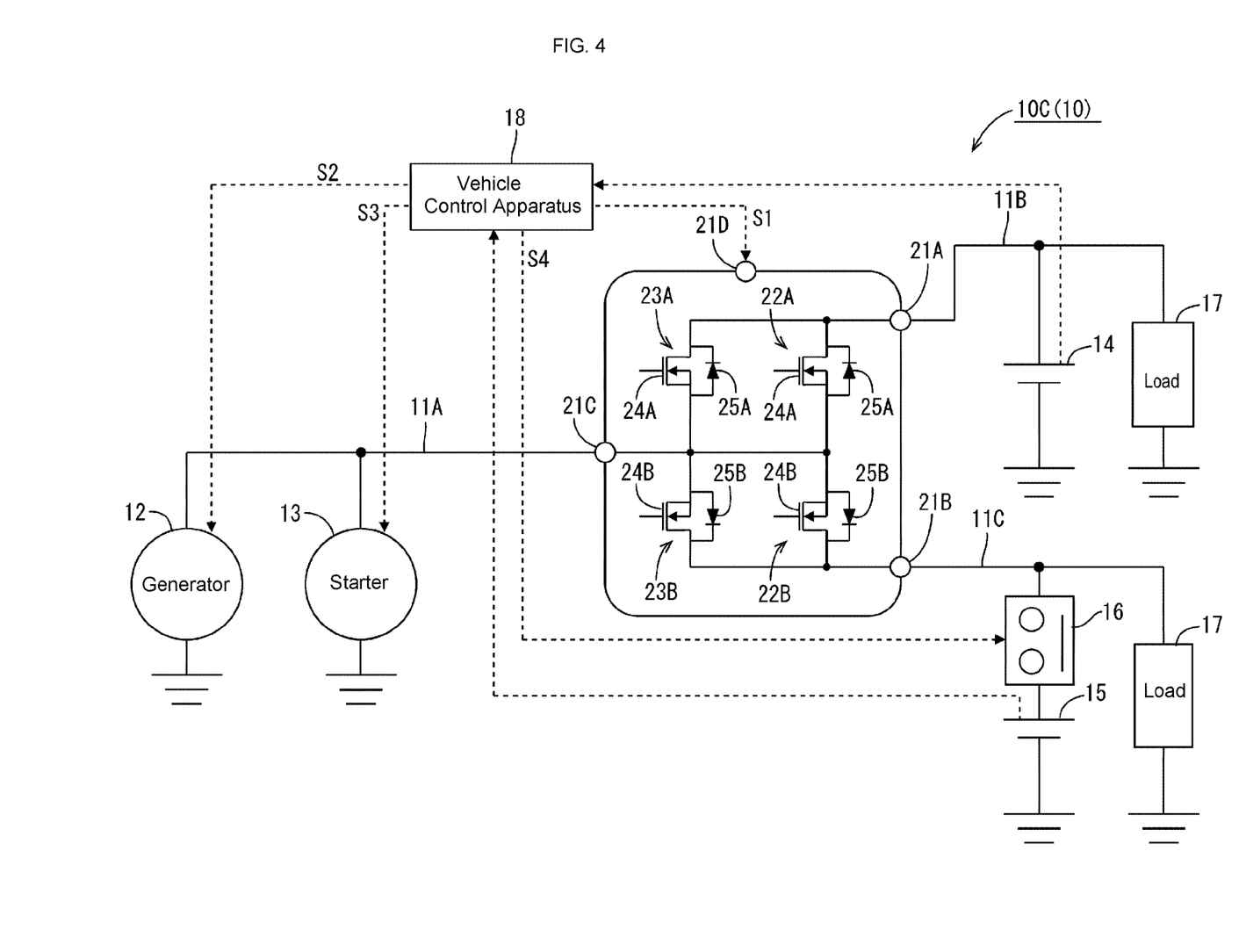
FIG. 4 is a diagram illustrating a third mode of the power supply system.

As shown in FIG. 4, in the third mode 10C, the first conduction path 11A is connected to the third terminal 21C, the second conduction path 11B is connected to the first terminal 21A, and the third conduction path 11C is connected to the second terminal 21B. The first conduction path 11A is connected to the ground via the generator 12 and the starter 13 that are connected in parallel. The second conduction path 11B is connected to the ground via the first power storage part 14 and the load 17 that are connected in parallel. The third conduction path 11C is connected to the ground via the protection switch 16 and the second power storage part 15 that are connected in series, and the load 17 is connected in parallel to the protection switch 16 and the second power storage part 15.

According to the third mode 10C, in the state where the FETs 22A, 22B, 23A, and 23B are turned on by the signals from the drive parts 27A and 27B, flow of electricity is enabled in both directions between the first conduction path 11A and the second conduction path 11B, between the first conduction path 11A and the third conduction path 11C, and between the second conduction path 11B and the third conduction path 11C. On the other hand, in a state where all of the FETs 22A, 22B, 23A, and 23B are turned off, the flow of electricity from the first conduction path 11A side to the second conduction path 11B side and the third conduction path 11C side is enabled, and the flow of electricity from the second conduction path 11B side and the third conduction path 11C side to the first conduction path 11A side is interrupted, by the diodes 25A and 25B. With this configuration, it is possible to prevent the influence of an instantaneous voltage drop caused when the engine is started from reaching the first power storage part 14, the second power storage part 15, and the loads 17 on the second conduction path 11B and the third conduction path 11C sides. Also, because the directions of the diodes 25A and 25B that are connected in series are opposite to each other, flow of electricity can be interrupted in both directions in the state where the FETs 22A, 22B, 23A, and 23B are turned off. Accordingly, the power sources between the first power storage part 14 and the load 17 of the second conduction path 11B and the second power storage part 15 of the third conduction path 11C are separated, and it is possible to prevent the influence (influence of a voltage drop, overcurrent, or the like due to ground fault or the like) of one side of the second conduction path 11B and the third conduction path 11C from reaching the other side. If the second conduction path 11B or the third conduction path 11C fails, for example, it is possible to prevent the influence of the failure from occurring in the conduction path on the non-failed side, because the diodes 25A and 25B are paired.

According to the present embodiment, the following operations and effects are achieved.

The connection unit 20 is disposed between the first conduction path 11A that is connected to the first power supply and the second conduction path 11B that is connected to the second power supply, and can electrically connect the first conduction path 11A to the second conduction path 11B. The connection unit includes: the first terminal 21A that is connectable to the first conduction path 11A or the second conduction path 11B; the second terminal 21B that is connectable to the second conduction path 11B in the state where the first terminal 21A is connected to the first conduction path 11A, and that is connectable to the second conduction path 11B in the state where the first terminal 21A is connected to the second conduction path 11B; the third terminal 21C that is connectable to the first conduction path 11A in a state where at least one of the first terminal 21A and the second terminal 21B is connected to the second conduction path 11B; the first switch part 24A and the second switch part 24B that are connected to each other in series between the first terminal 21A and the second terminal 21B; the first diode 25A that is connected in parallel to the first switch part 24A; and the second diode 25B that is connected in parallel to the second switch part 24B, and that is connected in the opposite direction to the first diode 25A, wherein the third terminal 21C is electrically connected between the first switch part 24A and the second switch part 24B that are connected in series, the flow of electricity in one direction between the third terminal 21C and at least one of the first terminal 21A and the second terminal 21B is enabled and the flow of electricity in the direction opposite to the one direction is interrupted by the first diode 25A and the second diode 25B, by at least one of the first switch part 24A and the second switch part 24B being turned off, and flow of electricity in both directions between the first terminal 21A and the second terminal 21B is interrupted by the first diode 25A and the second diode 25B, in the state where the first switch part 24A and the second switch part 24B are turned off.

According to the present embodiment, by changing the combination of the first conduction path 11A or the second conduction path 11B connected to the first terminals 21A to 21D, the second terminals 21A to 21D, and the third terminals 21A to 21D, a mode in which the flow of electricity in one direction between the third terminal 21C and at least one of the first terminal 21A and the second terminal 21B is enabled by the first diode 25A and the second diode 25B by at least one of the first switch part 24A and the second switch part 24B being turned off, and a mode in which flow of electricity in both directions between the first terminal 21A and the second terminal 21B is interrupted by the first diode 25A and the second diode 25B in the state where the first switch part 24A and the second switch part 24B are turned off can be realized using the shared connection unit 20. As a result, the connection unit 20 can be shared when the power supply system 10 is configured in which the direction of the flow of electricity between the first conduction path 11A and the second conduction path 11B is changed. Therefore, it is possible to cope with the change in the direction of the flow of electricity between the first power storage part 14 and the second power storage part 15 while reducing the manufacturing cost.

The first switch parts 24A and the first diodes 25A are configured by the first FETs 22A and 23A, and the second switch parts 24B and the second diodes 25B are configured by the second FETs 22B and 23B, and the first diodes 25A and the second diodes 25B are arranged such that their anodes are electrically connected to the third terminal 21C.

With this configuration, compared with a configuration in which the cathodes of the diodes are electrically connected to the third terminal 21C, a failure of the FETs 22A, 22B, 23A, and 23B due to a large current flowing through the diodes can be suppressed, for example, when a ground fault on the generator 12 side occurs in a situation in which the third terminal 21C is connected to the first conduction path 11A to which the generator 12 is connected.

The connection unit 20 includes: the plurality of first switch parts 24A; the plurality of second switch parts 24B; the plurality of first diodes 25A; and the plurality of second diodes 25B, wherein the plurality of first diodes 25A are connected in parallel to each other, and the plurality of second diodes 25B are connected in parallel to each other.

In this manner, a current is divided into the plurality of diodes 25A and 25B, so that the current that can flow can be increased.

The power supply system 10 includes: the connection unit 20; the first power storage part 14; the second power storage part 15; the first conduction path 11A; the second conduction path 11B; and the load 17 that can receive power from at least one of the first power storage part 14 and the second power storage part 15.

With this configuration, the power supply system 10 can be configured in which the direction of the flow of electricity between the first power storage part 14 and the second power storage part 15 can be changed using the shared connection unit 20.

The first conduction path 11A includes the generator 12, the third terminal 21C is connected to the first conduction path 11A, and at least one of the first terminal 21A and the second terminal 21B is connected to the second conduction path 11B.

With this configuration, the power of the generator 12 can be supplied to the second power storage part 15.

The first terminal 21A and the second terminal 21B are both connected to the second conduction path 11B.

With this configuration, the current capacity between the generator 12 and the first power storage part 14 and the second power storage part 15 can be increased.

Other Embodiments

The technique described in the present specification is not limited to the embodiments described with reference to the above description and the drawings. The following embodiments are also included in the technical scope of the technique described in the present specification, for example.

The FETs 22A, 22B, 23A, and 23B are connected in parallel two by two according to the capacities of the storage batteries, but the present disclosure is not limited to this configuration. Three or more FETs may also be connected in parallel according to the capacities of the storage batteries. Also, without connecting a plurality of FETs in parallel, the plurality of FETs 22A and 22B (23A and 23B) may also be configured only in series connection.

The FETs 22A, 22B, 23A, and 23B (switch parts) are N-type, but the present disclosure is not limited to this configuration. The FETs may also be P-type. Also, the FETs 22A, 22B, 23A, and 23B are not limited to the configuration in which each of them includes a switch part and a diode. Each FET may also include a switch part (e.g., a mechanical relay) and a diode as individual components.

The invention claimed is:

1. A connection unit that is disposed between a first conduction path that is connected to a first power supply and a second conduction path that is connected to a second power supply, and that can electrically connect the first conduction path to the second conduction path, the connection unit comprising:
a first terminal that is connectable to the first conduction path or the second conduction path;
a second terminal that is connectable to the second conduction path in a state where the first terminal is connected to the first conduction path, and that is connectable to the second conduction path in a state where the first terminal is connected to the second conduction path;
a third terminal that is connectable to the first conduction path in a state where at least one of the first terminal and the second terminal is connected to the second conduction path;
a first switch part and a second switch part that are connected in series to each other between the first terminal and the second terminal and in parallel with the first conductive path;
a first diode that is connected in parallel to the first switch part, a cathode of the first diode is connected to the first terminal; and
a second diode that is connected in parallel to the second switch part, and a cathode of the second diode is connected to the second terminal so as to be connected in an opposite direction to the first diode,
wherein the third terminal is electrically connected between the first switch part and the second switch part that are connected in series,
flow of electricity in one direction between the third terminal and at least one of the first terminal and the second terminal is enabled and flow of electricity in the direction opposite to the one direction is interrupted by the first diode and the second diode, by at least one of the first switch part and the second switch part being turned off, and
flow of electricity between the first terminal and the second terminal is interrupted in both directions by the first diode and the second diode, in a state where the first switch part and the second switch part are turned off.

2. The connection unit according to claim 1, wherein the first switch part and the first diode are configured by a first FET, and the second switch part and the second diode are configured by a second FET, and
the first diode and the second diode are arranged such that their anodes are electrically connected to the third terminal.

3. The connection unit according to claim 1, comprising:
a plurality of the first switch parts; a plurality of the second switch parts; a plurality of the first diodes; and a plurality of the second diodes,
wherein the plurality of first diodes are connected in parallel to each other, and the plurality of second diodes are connected in parallel to each other.

4. A power supply system comprising:
a connection unit that is disposed between a first conduction path that is connected to a first power supply and a second conduction path that is connected to a second power supply, and that can electrically connect the first conduction path to the second conduction path, the connection unit including:

a first terminal that is connectable to the first conduction path or the second conduction path;

a second terminal that is connectable to the second conduction path in a state where the first terminal is connected to the first conduction path, and that is connectable to the second conduction path in a state where the first terminal is connected to the second conduction path;

a third terminal that is connectable to the first conduction path in a state where at least one of the first terminal and the second terminal is connected to the second conduction path;

a first switch part and a second switch part that are connected in series to each other between the first terminal and the second terminal and in parallel with the first conductive path;

a first diode that is connected in parallel to the first switch part, a cathode of the first diode is connected to the first terminal; and a second diode that is connected in parallel to the second switch part, and a cathode of the second diode is connected to the second terminal so as to be connected in an opposite direction to the first diode, wherein the third terminal is electrically connected between the first switch part and the second switch part that are connected in series, flow of electricity in one direction between the third terminal and at least one of the first terminal and the second terminal is enabled and flow of electricity in the direction opposite to the one direction is interrupted by the first diode and the second diode, by at least one of the first switch part and the second switch part being turned off, and flow of electricity between the first terminal and the second terminal is interrupted in both directions by the first diode and the second diode, in a state where the first switch part and the second switch part are turned off; and a load that can receive power from at least one of the first power supply and the second power supply.

5. The power supply system according to claim 4, wherein the first terminal and the second terminal are both connected to the second conduction path.

6. The power supply system according to claim 4, wherein the first terminal is connected to the first conduction path, the second terminal is connected to the second conduction path, and the third terminal is open.

7. The power supply system according to claim 4, wherein the load is an electric power steering apparatus.

8. The connection unit according to claim 2, comprising:

a plurality of the first switch parts; a plurality of the second switch parts; a plurality of the first diodes; and a plurality of the second diodes, wherein the plurality of first diodes are connected in parallel to each other, and the plurality of second diodes are connected in parallel to each other.

9. The power supply system according to claim 4, wherein the first switch part and the first diode are configured by a first FET, and the second switch part and the second diode are configured by a second FET, and the first diode and the second diode are arranged such that their anodes are electrically connected to the third terminal.

10. The power supply system according to claim 4, further including:

a plurality of the first switch parts; a plurality of the second switch parts; a plurality of the first diodes; and a plurality of the second diodes, wherein the plurality of first diodes are connected in parallel to each other, and the plurality of second diodes are connected in parallel to each other.

11. The power supply system according to claim 9, further including:

a plurality of the first switch parts; a plurality of the second switch parts; a plurality of the first diodes; and a plurality of the second diodes, wherein the plurality of first diodes are connected in parallel to each other, and the plurality of second diodes are connected in parallel to each other.

12. The power supply system according to claim 5, wherein the first terminal is connected to the first conduction path, the second terminal is connected to the second conduction path, and the third terminal is open.

13. The power supply system according to claim 5, wherein the load is an electric power steering apparatus.

14. The power supply system according to claim 6, wherein the load is an electric power steering apparatus.

* * * * *